US010600451B1

(12) United States Patent
Yang

(10) Patent No.: US 10,600,451 B1
(45) Date of Patent: Mar. 24, 2020

(54) COMBINATION OF ANALOG AND DIGITAL AUDIO PLAYERS ON A SINGLE CABINET

(71) Applicant: Shenzhen 1Byone Technology Co., Ltd., Guangdong (CN)

(72) Inventor: Ruishi Yang, Guangdong (CN)

(73) Assignee: SHENZHEN 1BYONE TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/220,538

(22) Filed: Dec. 14, 2018

(30) Foreign Application Priority Data

Sep. 4, 2018 (CN) .......................... 2018 1 1027927
Sep. 4, 2018 (CN) ..................... 2018 2 1441284 U

(51) Int. Cl.
  *G11B 33/12* (2006.01)
  *H05K 5/00* (2006.01)
  *G11B 33/14* (2006.01)
  *G11B 33/08* (2006.01)

(52) U.S. Cl.
  CPC ............ *G11B 33/125* (2013.01); *G11B 33/08* (2013.01); *G11B 33/1406* (2013.01); *H05K 5/0026* (2013.01); *G11B 33/126* (2013.01); *G11B 33/127* (2013.01); *G11B 33/128* (2013.01)

(58) Field of Classification Search
  None
  See application file for complete search history.

(56) References Cited

U.S. PATENT DOCUMENTS

| 5,465,240 | A | * | 11/1995 | Mankovitz | ............. | G09B 5/065 360/48 |
| 6,621,768 | B1 | * | 9/2003 | Keller | .................... | G11B 17/22 369/30.05 |
| 7,242,642 | B2 | * | 7/2007 | Endo | ........................ | G11B 7/28 369/30.05 |
| 7,630,157 | B1 | * | 12/2009 | Goeppner | .......... | G11B 33/1486 360/60 |

(Continued)

*Primary Examiner* — Tan X Dinh
(74) *Attorney, Agent, or Firm* — Muncy, Geissler, Olds & Lowe, PC

(57) ABSTRACT

The present invention relates to a combined record player, wherein analog audio players are positioned on a top portion or a side portion of a cabinet, a digital audio player is positioned on a front portion of the cabinet, a first PCB is positioned on a front portion or a bottom portion of the cabinet, a second PCB is positioned on a rear portion of the cabinet, and an analog audio output interface is positioned on a rear surface of the cabinet; the first PCB contains an analog-to-digital signal converter, the second PCB contains a digital-to-analog signal converter, the analog audio players are electrically connected to the analog-to-digital signal converter, the digital audio player is electrically connected to the digital-to-analog signal converter, the analog-to-digital signal converter is electrically connected to the digital-to-analog signal converter, and the digital-to-analog signal converter is electrically connected to the analog audio output interface. The invention can integrate the analog audio players and the digital audio player within a cabinet where electrical wires between components in the cabinet do not interfere with each other and keep neat, and both the first PCB and the second PCB have a larger heat dissipation space.

7 Claims, 3 Drawing Sheets

(56) References Cited

U.S. PATENT DOCUMENTS

| | | | |
|---|---|---|---|
| 8,139,446 B2* | 3/2012 | Ieda | G11B 20/10527 369/292 |
| 2004/0091126 A1* | 5/2004 | Hirade | G10H 1/0041 381/119 |
| 2007/0030766 A1* | 2/2007 | Tanaka | G11B 19/025 369/30.05 |

* cited by examiner

COMBINATION OF ANALOG AND DIGITAL AUDIO PLAYERS ON A SINGLE CABINET

TECHNICAL FIELD

The present invention relates to an audio-video device, and in particular to a combined record player.

BACKGROUND ART

There are many ways of storing sound, for example, sound can be burned on a vinyl record, a cassette, or a CD, or can be saved as a digital audio file such as MP3. In order to satisfy the needs of users to play sounds stored on different types of carriers, it is necessary to integrate various players. However, the way of reading the sound carriers and the way of processing the audio are different for different types of integrated players, so that sound can only be played with the assistance of various accessories. Accordingly, the increases in the types of accessories will make an integrated system of various players look cumbersome and the connection between the accessories is complicated and chaotic. Moreover, the height collection of various electrical accessories may also lead to poor heat dissipation of the integrated system of various players and damage the electrical accessories.

SUMMARY OF THE INVENTION

It is therefore an object of the present invention to provide a combined record player free from the aforesaid drawbacks of the prior art, integrating an analog audio player and a digital audio player into a cabinet where connection between all components in the cabinet will not interfere with each other and stay in order, and both a first PCB (Printed circuit board) and a second PCB have a larger heat dissipation space.

In order to achieve the object of the invention, a combined record player according to the present invention includes a cabinet, at least two analog audio players, a digital audio player, a first PCB, a second PCB, and an analog audio output interface.

The analog audio players are positioned in a top portion or a side portion of the cabinet, the digital audio player is positioned in a front portion of the cabinet, the first PCB is positioned in a front portion or a bottom portion of the cabinet, a second PCB is positioned in a rear portion of the cabinet, and an analog audio output interface is positioned on a rear surface of the cabinet.

The first PCB contains an analog-to-digital signal converter, the second PCB contains a digital-to-analog signal converter. Specifically, the analog audio players are electrically connected to the analog-to-digital signal converter, the digital audio player is electrically connected to the digital-to-analog signal converter, the analog-to-digital signal converter is electrically connected to the digital-to-analog signal converter, and the digital-to-analog signal converter is electrically connected to the analog audio output interface.

At least two analog audio players and at least one digital audio player are integrated in the combined record player. The analog audio players output analog audio signals, the digital audio player outputs a digital audio signal, and the analog audio output interface transmits an analog audio signal. The plurality of analog audio players can convert the analog audio signals to digital audio signals by sharing the analog-to-digital signal converter arranged on the first PCB, then the digital audio signals are converted to analog audio signals by sharing the digital-to-analog signal converter installed on the second PCB with the digital audio player, such as CD player, and finally the converted analog audio signals are transmitted to a peripheral audio amplification device through the analog audio output interface, thereby reducing the number of the digital-to-analog signal converter and the analog-to-digital signal converter.

The digital audio player is positioned in a front portion of the cabinet, and the second PCB is positioned in a rear portion of the cabinet, so that the electrical wire connecting the digital audio player and the digital-to-analog signal converter installed on the second PCB is shorter and is directed horizontally from front to rear.

The analog audio player is positioned in a top portion or a side portion of the cabinet, the first PCB is positioned in a front portion of the cabinet, so that the electrical wires connecting the analog audio player and the analog-to-digital signal converter installed on the first PCB is directed obliquely from top to front or horizontally from a side to front.

The first PCB and the second PCB are positioned on front portion and the rear portion of the cabinet, respectively, so that the electrical wires connecting the analog-to-digital signal converter installed on the first PCB and the digital-to-analog signal converter installed on the second PCB are directed obliquely from front to rear. Therefore, the wires electrically connected between the components in the combined record player do not interfere with each other and are neatly organized.

Furthermore, the analog audio players include a record player positioned in a top portion of the cabinet and a cassette player positioned in a side portion of the cabinet, which are both electrically connected to the analog-to-digital signal converter.

The record player is positioned in a top portion of the cabinet so that the record will be more stable when the record player is rotated to play the record, and the sound produced by the record player is better.

The cassette player is positioned in a side portion of the cabinet so that a user can conveniently put the cassette from the side surface of the cabinet into the cassette player.

Further, the digital audio player includes a CD player which is positioned on a bottom surface of a front portion of the cabinet and is electrically connected to the analog-to-digital signal converter.

The CD player can be securely attached to the surface of the front portion of the cabinet, thereby preventing the vibration of the CD player which can affect sound quality during playing.

Further, the first PCB is perpendicular to the bottom surface of the cabinet and the second PCB is parallel to the bottom surface of the cabinet.

Since the first PCB is positioned in a front portion of the cabinet and perpendicular to the bottom surface of the cabinet, and the second PCB is positioned on a bottom surface of the rear portion of the cabinet and parallel to a bottom surface of the cabinet, a sufficient space can be formed between the first PCB and the second PCB for the first PCB and the second PCB to dissipate heat, which can avoid damage to various components in the cabinet due to excessive temperature in the cabinet.

Preferably, the analog audio players further include a radio comprising an antenna, a radio play circuit, and a frequency modulation circuit, which are installed on the first PCB. The radio play circuit and the frequency modulation circuit are electrically connected to the antenna, and the radio play circuit is electrically connected to the analog-to-digital signal converter.

The combined record player can also include an integrated radio. After the antenna receives frequency signals, an analog audio signal is output through the radio play circuit, and the frequency range of the frequency signals received by the antenna can be adjusted by the frequency modulation circuit. The radio, the record player, and the cassette player can convert the analog audio signals output by the radio play circuit to digital audio signals by sharing the analog-to-digital signal converter installed on the first PCB, then the digital audio signals are converted to analog audio signals by sharing the digital-to-analog signal converter installed on the second PCB with the CD player, and finally the converted analog audio signals are transmitted to a peripheral audio amplification device through the analog audio output interface. Thus, the integrated radio can be added without adding any digital-to-analog signal converters or analog-to-digital signal converters.

The antenna, the radio play circuit, and the frequency modulation circuit included in the radio are all installed on the first PCB, so that the electrical connection between the radio play circuit and the antenna, between the frequency modulation circuit and the antenna, and the electrical connection between the radio play circuit and the analog-to-digital signal converter can be realized by the wires on the first PCB, which can avoid complex wiring. Therefore, adding the integrated radio will not lead to an increase in electrical wires, and will also not affect the heat dissipation space inside the cabinet.

Preferably, the digital audio player further includes an MP3 player comprising a USB interface and an MP3 play circuit electrically connected to the digital-to-analog signal converter, which are electrically connected to each other and are both installed on the first PCB.

The combined record player can also include an integrated MP3 player. The USB interface can be externally connected to memory to read an MP3 file stored in the memory, and the MP3 play circuit can play the MP3 file and output digital audio signals. The MP3 player and the CD player can convert the digital audio signals to analog audio signals by sharing the digital-to-analog signal converter, and finally the converted analog audio signals are transmitted to the peripheral audio amplification device through the analog audio output interface, so that the integrated MP3 player can be added without adding any digital-to-analog signal converters or analog-to-digital signal converters.

Both the USB interface and the MP3 player circuit included in the MP3 player are installed on the first PCB, so that the electrical connection between the USB interface and the MP3 play circuit can be realized by the electrical wires on the first PCB, and the wires electrically connected to the MP3 play circuit and the digital-to-analog signal converter installed on the second PCB is directed obliquely from front to rear. Therefore, the added wires caused by adding the integrated MP3 player will neither interfere with other wires nor cause messiness, and will not affect the heat dissipation space inside the cabinet.

Further, the combined record player further includes two soundboxes, the two soundboxes positioned on two side portions of the cabinet, respectively, each soundbox containing a speaker electrically connected to the digital-to-analog signal converter.

The cassette player is positioned on the soundbox, and the CD player is located between the two soundboxes.

One side surface of the soundbox is connected to the side surface of a cabinet, a bottom surface of the soundbox is connected to a bottom surface of the cabinet, the length of the soundbox is less than half of the difference between the length of an inner wall of the cabinet and the length of the CD player, the height of the soundbox is smaller than the difference between the height of the inner wall of the cabinet and the height of the cassette player, and the width of the soundbox is smaller than the width of the inner wall of the cabinet.

The analog audio signal converted by the digital-to-analog signal converter can be amplified by the speakers. The speakers are located inside the soundboxes, which can improve sound quality.

The length of the soundbox is less than half of the difference between the length of the inner wall of the cabinet and length of the CD player, so that the soundbox can avoid the CD player located between the two soundboards and on the bottom surface of the front portion of the cabinet.

The height of the soundbox is less than the difference between the height of the inner wall of the cabinet and the height of the cassette player, so that the soundbox can avoid the record player located at the top portion of the cabinet and the cassette player on the soundbox.

The width of the soundbox is less than the width of the inside wall of the cabinet, so that the front surface of the soundbox will not be brought into contact with the front surface of the cabinet, and the rear surface of the soundbox will also not bring into contact with the rear surface of the cabinet.

By designing the size and location of the soundbox, only one side surface and one bottom surface of the soundbox are connected to the cabinet, so that the soundbox will not be limited by the cabinet and can vibrate more freely.

The cassette player is located on the soundbox, and the height of the soundbox also makes the cassette player at an intermediate portion of the side portion of the cabinet, so that the cassette player can avoid the soundbox and a tape entrance of the cassette player can be positioned just at the intermediate portion of the side surface of the cabinet, thereby facilitating a user to place a cassette into the cassette player.

Further, the soundbox contains an inverted tube connecting the rear surface of the cabinet and the rear surface of the soundbox. The inverted tube contains a spacer surrounding the inverted tube.

The inverted tube can make full use of the energy of a sound wave radiated inward in the soundbox to make the air in the inverted tube vibrate and generate sound, which can widen the low frequency dive and volume, and increase the overall output efficiency. Through the spacer surrounding the inverted tube, the internal air vibration produced by the soundbox, the record player, the cassette player, and the CD player in the cabinet will not interfere with the vibration of the inverted tube, so that the sound played is purer and noise-free.

Further, the first PCB or the second PCB also includes a recording device electrically connected to the digital-to-analog signal converter.

If one of the record player, the cassette player, the radio, the MP3 player, or the CD player is playing, the analog audio signal converted by the digital-to-analog signal converter is sent to a recording device, and the recording device stores the analog audio signal to form digital audio data, so that the recording device can record the sound played by any one of the record player, the cassette player, the radio, the MP3 player, and the CD player.

If the record player, the cassette player, the radio, the MP3 player, and the CD player are not playing, the recording device transmits the recorded sound to the digital-to-analog signal converter, that is, the recording device transmits the digital audio data stored therein to the digital-to-analog signal converter in a form of a digital audio signal. Then, the digital-to-analog signal converter converts the digital audio signal transmitted by the recording device into an analog audio signal, and transmits the analog audio signal to the audio amplification device of the peripheral through the analog audio output interface or to the speaker in the soundbox, so that the sound recorded by the recording device can be played.

Further, the record player includes a record movement and a movement base plate, wherein the movement base plate is positioned on a top portion of the cabinet and contains a hollow area, the record movement is clamped in the hollow area, the edge of the hollow area contains a plurality of support members, and the bottom surface of the record movement contains spring supports each of which is at a position corresponding to each support member, and each spring support is connected to each support member.

Since the record player needs to mechanically rotate the record when reading sound recorded on the record, the record may be shaken when rotated. While the spring supports installed on the bottom surface of the record movement are supported on the support member to cushion and dampen vibration, thereby improving the stability of the sound quality of the record player.

Further, each support member contains a recess, and the spring support is positioned at a bottom portion of the recess.

The spring support is positioned at a bottom portion of the recess, so that the inner sidewall of the recess can limit movement of the spring support in the horizontal direction, therefore the record movement can be in a fixed state while the record is rotated on the record movement, and the record movement can smoothly read the record.

Further, the record movement is provided with a regulator for adjusting the elastic force of the spring supports.

The ability of the spring support to cushion and dampen the vibration can be adjusted by adjusting the spring force of the spring support by the regulator. When the vibration produced by the record movement while reading a record is large, the spring force of the spring support can be reduced by the regulator to increase the ability of the spring support to cushion and dampen the vibration; when the vibration produced by the record movement while reading a record is small, the spring force of the spring support can be increased by the regulator to prevent the record movement from moving up and down excessively.

The present invention offers additional benefits to the existing prior art, which will become apparent in the following description.

(1) The sound player components such as the record player, the cassette player, the CD player, the radio, the MP3 player, or the like are integrated into a single cabinet to form a combined record player, which can play sounds of different storage forms. Moreover, after the sound play components are integrated, the digital-to-analog signal converter and the analog-to-digital signal converter can be shared to reduce the number of signal converters.

(2) Through the layout design of the record player, the cassette player, the CD player, the radio, the MP3 player, the first PCB, and the second PCB, not only can the electric wires in the cabinet be neat and not interfere with each other, but sufficient heat dissipation space can be formed to avoid damage to various components in the cabinet due to excessive temperature in the cabinet.

(3) Through the size and layout of the soundbox, the arrangement of the inverted tube and the spacer surrounding the inverted tube, the sound played by the speaker in the soundbox can be made purer and noise-free.

(4) Through the spring support installed on the bottom surface of the record movement, in which the spring support is connected to the support member provided on the edge of the hollow area of the movement base plate, the record movement can be in a fixed state while the record is rotated on the record movement, and achieve the effect of cushion and dampen the vibration, thereby improving the stability of the sound quality of the record player.

Figure 1:
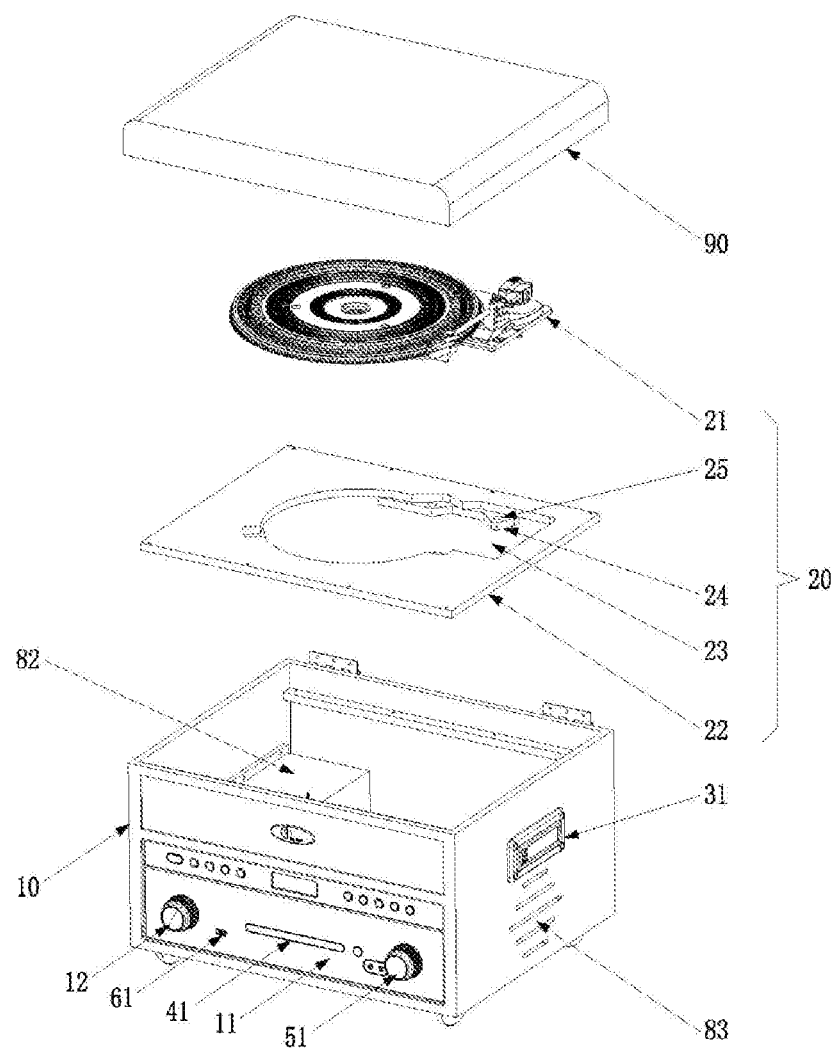
FIG. 1 is an exploded view of an embodiment of the invention.

DESCRIPTION OF THE REFERENCE SIGNS 10 cabinet 11 control panel 12 tuning knob 20 record player 21 record movement 22 movement base plate 23 hollow area 24 support member 25 recess 30 cassette player 31 cassette entrance 40 CD player 41 CD entrance 42 pad 51 frequency modulation knob 52 radio play circuit 61 USB interface 62 MP3 play circuit 71 first PCB 72 second PCB 73 analog-to-digital signal converter 74 digital-to-analog signal converter 81 analog audio output interface 82 soundbox 83 speaker 84 inverted tube 90 top cover

DESCRIPTION OF EMBODIMENTS

The drawings are for the purposes of illustration only and are not intended to limit the invention.

Some components in the drawings are omitted, enlarged or reduced for better description of the embodiment, and sizes of these components do not represent actual sizes thereof.

It will be understood by those skilled in the art that certain known structures in the drawings and descriptions thereof may be omitted.

As used in the description of the invention, it will be understood that the terms "first" and "second" are for the purpose of description only, and are not intended to indicate or imply a relative importance or an implied number of technical features indicated. Thus, the defined "first" and "second" features may include one or more of the features, either explicitly or implicitly. In the description of the invention, "a plurality of" means two or more unless otherwise stated.

In the description of the invention, it should be noted that, the terms "installed", "contains", "connected", "positioned" and "located" should be understood broadly unless otherwise clearly specified or defined. For example, they may refer to fixed connection, detachable connection, or integral connection; may refer to mechanical connection or electrical connection; may refer to direct connection or indirect connection through an intermediate medium, and may also refer to internal connection of two components. The specific meanings of the above terms in the invention may be understood in specific circumstances by those skilled in the art.

The technical solution of the invention will be further described below with reference to the drawings and the embodiment.

Embodiment

As shown in FIGS. 1 to 4, a combined record player according to the present embodiment includes a cabinet 10, at least two analog audio players, a digital audio player, a first PCB 71, a second PCB 72, and an analog audio output interface 81.

The analog audio players are positioned on a top portion or a side portion of the cabinet 10, the digital audio player is positioned on a front portion of the cabinet 10, the first PCB 71 is positioned on a front portion or a bottom portion of the cabinet 10, a second PCB 72 is positioned on a rear portion of the cabinet 10, and an analog audio output interface 81 is positioned on a rear surface of the cabinet 10.

The first PCB 71 contains an analog-to-digital signal converter 73 and the second PCB 72 contains a digital-to-analog signal converter 74. Specifically, the analog audio players are electrically connected to the analog-to-digital signal converter 73, the digital audio player is electrically connected to the digital-to-analog signal converter 74, the analog-to-digital signal converter 73 is electrically connected to the digital-to-analog signal converter 74, and the digital-to-analog signal converter 74 is electrically connected to the analog audio output interface 81.

The analog audio players include a record player 20, a cassette player 30, a radio, and the digital audio players include a CD player 40 and an MP3 player.

The radio includes an antenna, a radio play circuit 52, and a frequency modulation circuit which are installed on the first PCB 71, in which the radio play circuit 52 and the frequency modulation circuit are electrically connected to the antenna. The MP3 player includes a USB interface 61 and an MP3 play circuit 62, which are electrically connected to each other and installed on the first PCB 71.

The record player 20 is positioned on a top portion of the cabinet 10, the cassette player 30 is positioned on a side portion of the cabinet 10, and the CD player 40 is positioned on a bottom surface of the front portion of the cabinet 10; the first PCB 71 is positioned on a front portion of the cabinet 10 and above the CD player 40, the second PCB 72 is positioned on a bottom surface of the rear portion of the cabinet 10, and the analog audio output interface 81 is positioned on a rear surface of the cabinet 10.

Figure 5:
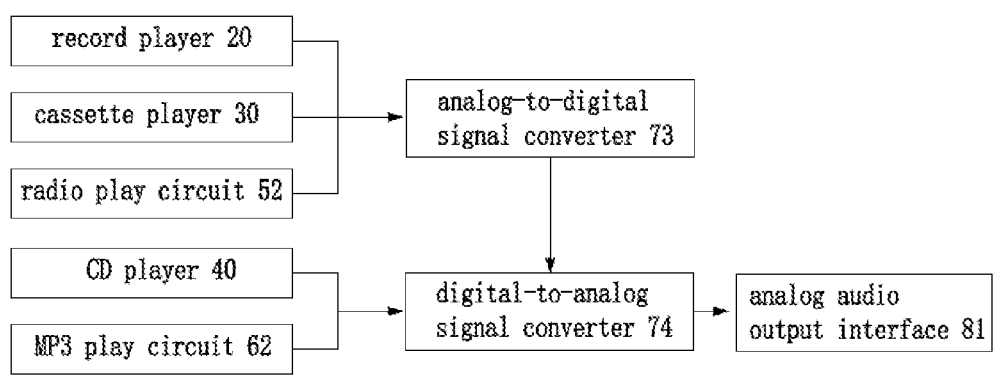
FIG. 5 is a diagram showing audio signal processing according to the embodiment of the invention.

As shown in FIG. 5, the record player 20, the cassette player 30, the radio play circuit 52 are electrically connected to the analog-to-digital signal converter 73, the CD player 40, the MP3 playback circuit 62 are electrically connected to the digital-to-analog signal converter 74, and the analog-to-digital signal converter 74 is electrically connected to the analog audio output interface 81.

The record player 20, the cassette player 30, the CD player 40, the radio, and the MP3 player are integrated in the combined record player, in which the record player 20, the cassette player 30, and the radio output analog audio signals, the CD player 40 and the MP3 player output digital audio signals, and the analog audio output interface 81 transmits an analog audio signal. The record player 20, the cassette player 30, and the radio may convert the analog audio signals to digital audio signals by sharing the analog-to-digital signal converter 73 arranged on the first PCB 71, then the digital audio signals are converted to analog audio signals by sharing the digital-to-analog signal converter 74 installed on the second PCB 72 with the CD player 41 and the MP3 player, and finally the converted analog audio signals are transmitted to a peripheral audio amplification device through the analog audio output interface 81, thereby reducing the number of the digital-to-analog signal converter 74 and the analog-to-digital signal converter 73.

The CD player 40 and the second PCB 72 are positioned on a bottom surface of the front and rear portions of the cabinet 10, respectively, so that the CD player 40 can be stably positioned on a bottom surface of the front portion of the cabinet 10 to prevent the vibration of the CD player 40 which affects the sound quality during playing. Moreover, the distance between the CD player 40 and the second PCB 72 can be relatively closer, and the electrical wire connecting the CD player 40 and the digital-to-analog signal converter 74 installed on the second PCB 72 is shorter and is directed horizontally from front to rear.

Preferably, a pad 42 is positioned between the CD player 40 and the bottom surface of the front portion of the cabinet 10. The pad 42 has a function of vibration isolation, so that the arrangement of the pad 42 can reduce the adverse effects of vibration of the cabinet 10 on the CD player 40 when the CD player 40 reads the CD.

The record player and the cassette player 30 are positioned on a top portion and a side portion of the cabinet 10, respectively, and the first PCB 71 is positioned on a front portion of the cabinet 10, so that the electrical wire connecting the record player and the analog-to-digital signal converter 73 installed on the first PCB 71 is directed obliquely from top to front, and the electrical wire connecting the cassette player 30 and the analog-to-digital signal converter 73 installed on the first PCB 71 is directed horizontally from a side to front.

The first PCB 71 and the second PCB 72 are positioned on a front portion and a bottom surface of the rear portion of the cabinet 10, respectively, and the electrical wire connecting the analog-to-digital signal converter 73 installed on the first PCB 71 and the digital-to-analog signal converter 74 installed on the second PCB 72 is directed obliquely from front to rear.

The antenna, the radio play circuit 52, and the frequency modulation circuit included in the radio are all installed on the first PCB 71, so that the electrical connection between the radio play circuit 52 and the antenna, between the frequency modulation circuit and the antenna, and the electrical connection between the radio play circuit 52 and the analog-to-digital signal converter 73 can be realized by the wires on the first PCB 71 without causing an increase in the number of electrical wires.

Both the USB interface 61 and the MP3 player circuit 62 included in the MP3 player are installed on the first PCB 71, so that the electrical connection between the USB interface 61 and the MP3 play circuit 62 can be realized by the wires on the first PCB 71, and the electrical wires connecting the MP3 play circuit 62 and the digital-to-analog signal converter 74 installed on the second PCB 72 is directed obliquely from front to rear.

In summary, the wires electrically connecting the components in the combined record player do not interfere with each other and are neat.

The front surface of the cabinet 10 also includes a control panel 11, and both a CD inlet 41 of the CD player 40 and a USB interface 61 of the MP3 player are installed on the control panel 11. The control panel 11 further includes a tuning knob 12 and a frequency modulation knob 51. The tuning knob 12 is electrically connected to the digital-to-analog signal converter 74 so as to adjust the volume of the playing sound by adjusting the amplitude of the analog audio signal converted by the digital-to-analog signal converter 74. The frequency modulation knob 51 electrically connected to the frequency modulation circuit is configured to control the frequency modulation circuit to adjust a frequency range of signals received by the antenna.

As shown in FIG. 1, preferably, the combined record player also includes a top cover 90 which is hinged to the cabinet 10. When the record player 20 needs to be used, the top cover 90 can be opened; when the record player 20 is not required, the top cover 90 can be closed to protect the record player 20.

Figure 2:
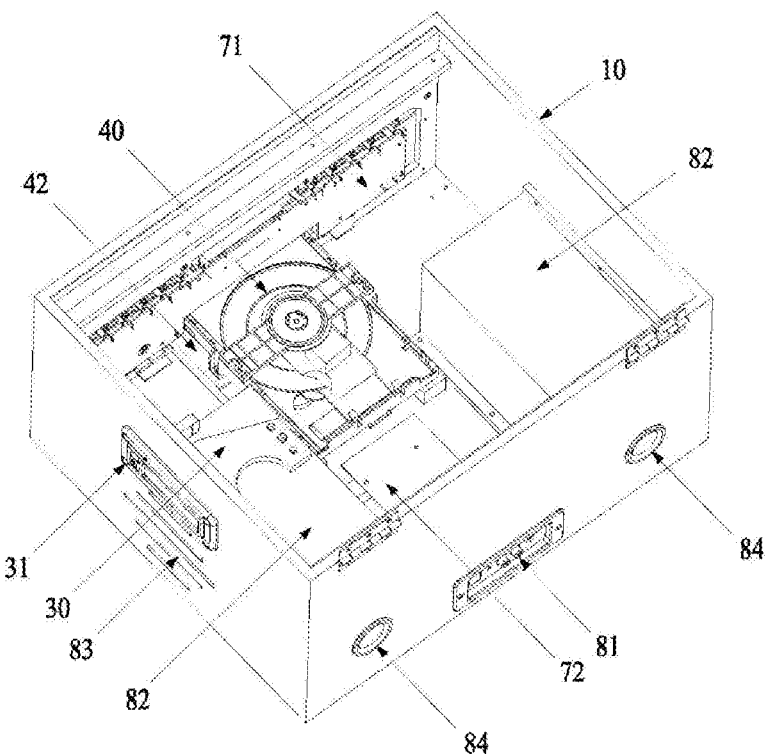
FIG. 2 is a schematic view showing the interior of a cabinet according to an embodiment of the invention.
Figure 3:
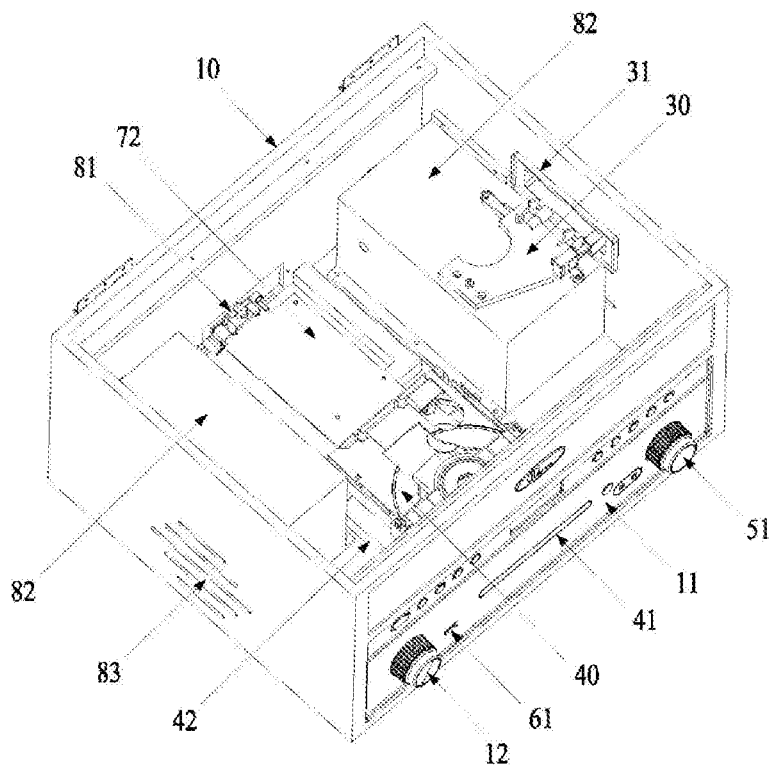
FIG. 3 is another schematic view showing the interior of the cabinet according to the embodiment of the invention.
Figure 4:
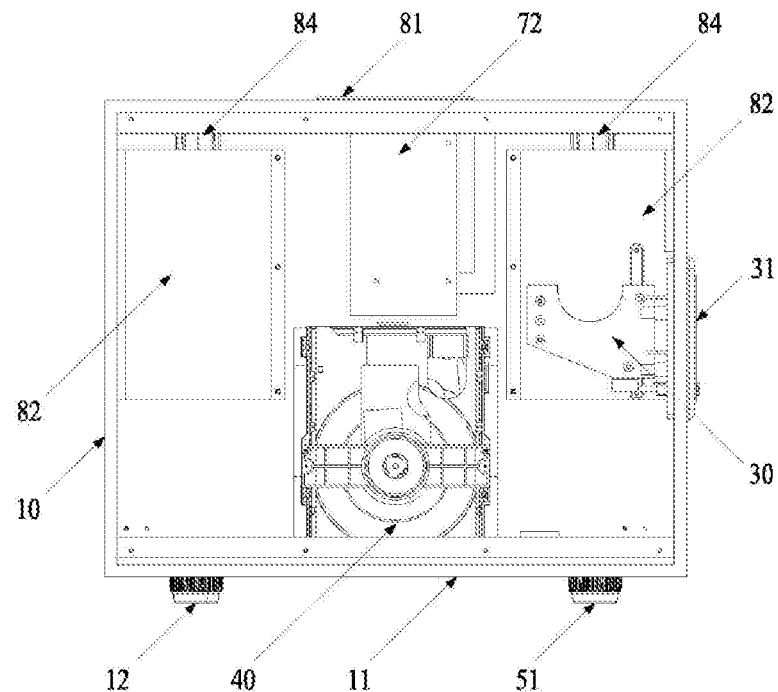
FIG. 4 is a top view showing the interior of the cabinet according to the embodiment of the invention.

As shown in FIGS. 2 to 4, in the embodiment, the first PCB 71 is perpendicular to the bottom surface of the cabinet 10, and the second PCB 72 is parallel to the bottom surface of the cabinet 10.

Since the first PCB 71 is positioned in a front portion of the cabinet 10 and perpendicular to the bottom surface of the cabinet 10, and the second PCB 72 is positioned on a bottom surface of the rear portion of the cabinet 10 and parallel to the bottom surface of the cabinet 10, a sufficient space can be formed between the first PCB 71 and the second PCB 72 for the first PCB 71 and the second PCB 72 to dissipate heat, which can avoid damage to various components in the cabinet 10 due to excessive temperature.

In the embodiment, the combined record player further includes two soundboxes 82 positioned on two side portions of the cabinet 10, respectively, and each soundbox 82 contains a speaker 83 electrically connected to the digital-to-analog signal converter 74.

The cassette player 30 is positioned in the soundbox 82, and the CD player 40 is positioned between the two soundboxes 82.

One side surface of the soundbox 82 is connected to one side surface of cabinet 10, the bottom surface of the soundbox 82 is connected to the bottom surface of the cabinet 10, the length of the soundbox 82 is less than half of the difference between the length of an inner wall of the cabinet 10 and the length of the CD player 40, the height of the soundbox 82 is smaller than the difference between the height of the inner wall of the cabinet 10 and the height of the cassette player 30, and the width of the soundbox 82 is smaller than the width of the inner wall of the cabinet 10.

The analog audio signal converted by the digital-to-analog signal converter 74 can be amplified by the speakers 83. The speaker 83 is disposed inside the soundbox 82, which can improve sound quality.

The length of the soundbox 82 is less than half of the difference between the length of the inner wall of the cabinet 10 and length of the CD player 40. Such configuration of the soundbox 82 can avoid the arrangement of the CD player 40 located between the two soundboards 82 and on the bottom surface of the front portion of the cabinet 10.

The height of the soundbox 82 is less than the difference between the height of the inner wall of the cabinet 10 and the height of the cassette player 30, so that the soundbox 82 can avoid the arrangement of the record player 20 located at the top portion of the cabinet 10 and the cassette player 30 on the soundbox 82.

The width of the soundbox 82 is less than the width of the inside wall of the cabinet 10, so that the front surface of the soundbox 82 will not be in contact with the front surface of the cabinet 10, and the rear surface of the soundbox 82 will also not be in contact with the rear surface of the cabinet 10.

By designing the size and location of the soundbox 82, only one side surface and one bottom surface of the soundbox 82 are connected to the cabinet 10, so that the soundbox 82 will not limit by the cabinet 10 and can vibrate more freely.

The cassette player 30 is located on the soundbox 82, and the height of the soundbox 82 allows the cassette player 30 to be located at an intermediate portion of the side portion of the cabinet 10, so that the cassette player 30 doesn't interfere with the arrangement of the soundbox 82 and the cassette tape entrance 31 of the cassette player 30 can be positioned just at the intermediate portion of the side surface of the cabinet 10, thereby facilitating a user to place a cassette into the cassette player 30.

The side surfaces of the first PCB 71, the second PCB 72, and the two soundboxes 82 may constitute a larger heat dissipation space, which will facilitate to dissipate heat from the first PCB 71 and the second PCB 72.

Preferably, a heat sink is installed on the top surface of the second PCB 72 to further improve heat dissipation performance of the second PCB 72.

In the present embodiment, the soundbox 82 contains an inverted tube 84 connected to the rear surfaces of the cabinet 10 and the soundbox 82; and a spacer surrounds the inverted tube 84.

The inverted tube 84 can make full use of the energy of a sound wave radiated inward in the soundbox 82 to make the air in the inverted tube 84 vibrate and generate sound, which can widen the low frequency dive and volume, and increase the overall output efficiency. Through the spacer surrounding the inverted tube 84, the internal air vibration produced by the soundbox 82, the record player 20, the cassette player 30, and the CD player 40 in the cabinet 10 will not interfere with the vibration of the inverted tube 84, so that the sound played is purer and noise-free.

In the present embodiment, the first PCB 71 or the second PCB 72 also contains a recording device electrically connected to the digital-to-analog signal converter 74.

If one of the record player 20, the cassette player 30, the radio, the MP3 player, or the CD player 40 is playing, the analog audio signal converted by the digital-to-analog signal converter 74 is sent to a recording device, and the recording device stores the analog audio signal to form digital audio data, so that the recording device can record the sound played by any one of the record player 20, the cassette player 30, the radio, the MP3 player, and the CD player 40.

If the record player 20, the cassette player 30, the radio, the MP3 player, and the CD player 40 are not playing, the recording device transmits the recorded sound to the digital-to-analog signal converter 74, that is, the recording device transmits the digital audio data stored therein to the digital-to-analog signal converter 74 in a form of a digital audio signal. Then, the digital-to-analog signal converter 74 converts the digital audio signal transmitted by the recording device into an analog audio signal, and transmits the analog audio signal to the audio amplification device of the peripheral through the analog audio output interface 81 or to the speaker 83 in the soundbox 82, so that the sound recorded by the recording device can be played.

As shown in FIG. 1, in the embodiment, the record player 20 includes a record movement 21 and a movement base plate 22, wherein the movement base plate 22 is positioned on a top portion of the cabinet 10 and contains a hollow area 23, the record movement 21 is clamped in the hollow area 23, the edge of the hollow area 23 contains a plurality of support members 24, and the bottom surface of the record movement 21 contains spring supports, each of which is at a position corresponding to each support member 24, and each spring support is connected to each support member 24.

Since the record player 20 needs to mechanically rotate the record when reading sound recorded on the record, the record may be shaken when rotated. The spring supports installed on the bottom surface of the record movement 21 are supported on the support member 24 to cushion and dampen vibration, thereby improving the stability of the sound quality of the record player 20.

In the present embodiment, each support member 24 contains a recess 25, and the spring support is positioned at a bottom portion of the recess 25.

The spring support is positioned at a bottom portion of the recess 25, so that the inner sidewall of the recess 25 can limit movement of the spring support in the horizontal direction, therefore the record movement 21 can be in a fixed state while the record is rotated on the record movement 21, and the record movement 21 can smoothly read the record.

In the present embodiment, the record movement 21 is provided with a regulator for adjusting the elastic force of the spring supports.

The ability of the spring support to cushion and dampen the vibration can be adjusted by adjusting the spring force of the spring support by the regulator. When the vibration produced by the record movement 21 while reading a record is large, the spring force of the spring support can be reduced by the regulator to increase the ability of the spring support to cushion and dampen the vibration; when the vibration produced by the record movement 21 while reading a record is small, the spring force of the spring support can be increased by the regulator to prevent the record movement 21 from moving up and down excessively.

The same or similar reference signs correspond to the same or similar components.

The positional relationships described in the drawings are illustrative only and are not intended to limit the invention.

Obviously, the above embodiment of the invention is merely examples for clear illustration, and is not intended to limit the implementation of the invention. Modifications or changes can be made by those of ordinary skill in the art on the basis of the above description. There is neither need nor exhaustion for all implementations. Any modification, equivalent substitution, improvement, or the like within the spirit and principle of the invention should be included in the scope of the claims of the invention.

The invention claimed is:

1. A combined record player comprising:
a cabinet;
at least two analog audio players, the at least two analog audio players comprising:
a record player positioned on a top portion of the cabinet and electrically connected to the analog-to-digital signal converter; and
a cassette player positioned on a side portion of the cabinet and electrically connected to the analog-to-digital signal converter;
a digital audio player positioned in a front portion of the cabinet, the digital audio player comprising a CD player positioned on a bottom surface of a front portion of the cabinet and electrically connected to the digital-to-analog signal converter;
a first PCB positioned in a front portion or a bottom portion of the cabinet and containing an analog-to-digital signal converter;
a second PCB positioned in a rear portion of the cabinet and containing a digital-to-analog signal converter;
an analog audio output interface positioned on a rear surface of the cabinet; and
two soundboxes on two side portions of the cabinet, respectively, each soundbox contains a speaker electrically connected to the digital-to-analog signal converter,
wherein the analog audio players are electrically connected to the analog-to-digital signal converter, the digital audio player is electrically connected to the digital-to-analog signal converter, the analog-to-digital signal converter is electrically connected to the digital-to-analog signal converter, and the digital-to-analog signal converter is electrically connected to the analog audio output interface,
wherein the cassette player is located on the soundbox, and the CD player is located between the two soundboxes, and
wherein one side surface of the soundbox is connected to the side surface of cabinet, a bottom surface of the soundbox is connected to the bottom surface of the cabinet, the length of the soundbox is less than half of the difference between the length of an inner wall of the cabinet and the length of the CD player, the height of the soundbox is smaller than the difference between the height of the inner wall of the cabinet and the height of the cassette player, and the width of the soundbox is smaller than the width of the inner wall of the cabinet.

2. The combined record player according to claim 1, wherein the first PCB is parallel to a front surface of the cabinet, and the second PCB is parallel to a bottom surface of the cabinet.

3. The combined record player according to claim 1, wherein the soundbox contains an inverted tube which is connected to the rear surfaces of the cabinet and the soundbox, and a spacer surrounds the inverted tube.

4. The combined record player according to claim 1, wherein the first PCB or the second PCB also contains a recording device electrically connected to the digital-to-analog signal converter.

5. A combined record player comprising:
a cabinet;
at least two analog audio players, the at least two analog audio players comprising:
a record player positioned on a top portion of the cabinet and electrically connected to the analog-to-digital signal converter; and
a cassette player positioned on a side portion of the cabinet and electrically connected to the analog-to-digital signal converter;
a digital audio player positioned in a front portion of the cabinet;
a first PCB positioned in a front portion or a bottom portion of the cabinet and containing an analog-to-digital signal converter;
a second PCB positioned in a rear portion of the cabinet and containing a digital-to-analog signal converter; and
an analog audio output interface positioned on a rear surface of the cabinet,
wherein the analog audio players are electrically connected to the analog-to-digital signal converter, the digital audio player is electrically connected to the digital-to-analog signal converter, the analog-to-digital signal converter is electrically connected to the digital-to-analog signal converter, and the digital-to-analog signal converter is electrically connected to the analog audio output interface, wherein the record player includes a record movement and a movement base plate positioned on a top portion of the cabinet and contains a hollow area, and wherein the record movement is clamped in the hollow area, the edge of the hollow area contains a plurality of support members, and the bottom surface of the record movement contains spring supports each of which is at a position corresponding to each support member, and each spring support is connected to each support member.

6. The combined record player according to claim 5, wherein each support member contains a recess, and the spring support is positioned at a bottom surface of the recess.

7. The combined record player according to claim 6, wherein the record movement contains a regulator for adjusting the elastic force of the spring support.

\* \* \* \* \*